US008692137B2

(12) United States Patent
Doneker et al.

(10) Patent No.: US 8,692,137 B2
(45) Date of Patent: Apr. 8, 2014

(54) NOISE DAMPENING ENERGY EFFICIENT TAPE AND GASKET MATERIAL

(75) Inventors: Robert L. Doneker, Portland, OR (US); Kent G. R. Thompson, Portland, OR (US)

(73) Assignee: Tangitek, LLC, Portland, OR (US)

( * ) Notice: Subject to any disclaimer, the term of this patent is extended or adjusted under 35 U.S.C. 154(b) by 210 days.

(21) Appl. No.: 13/172,694

(22) Filed: Jun. 29, 2011

(65) Prior Publication Data

US 2011/0253441 A1    Oct. 20, 2011

(51) Int. Cl.
*H05K 9/00* (2006.01)

(52) U.S. Cl.
USPC ........................................ 174/394; 428/293.7

(58) Field of Classification Search
USPC ......... 174/388, 394, 386; 361/816; 428/293.7
See application file for complete search history.

(56) References Cited

U.S. PATENT DOCUMENTS

| | | | |
|---|---|---|---|
| 4,684,020 A | | 8/1987 | Ohlbach |
| 4,703,134 A | | 10/1987 | Uematsu |
| 4,986,372 A | | 1/1991 | Ganssle |
| 5,010,209 A | | 4/1991 | Marciano-Agostinelli et al. |
| 5,028,740 A | * | 7/1991 | Tomiya ........................ 174/373 |
| 5,043,538 A | | 8/1991 | Hughey et al. |
| 5,170,010 A | | 12/1992 | Aldissi |
| 5,236,736 A | | 8/1993 | Kawakami et al. |
| 5,300,733 A | | 4/1994 | Uematsu |
| 5,401,901 A | | 3/1995 | Gerry et al. |
| 5,486,648 A | | 1/1996 | Chan et al. |
| 5,539,148 A | | 7/1996 | Konishi et al. |
| 6,215,070 B1 | | 4/2001 | King |
| 6,384,337 B1 | | 5/2002 | Drum |
| 6,526,860 B2 | | 3/2003 | Facciano et al. |
| 6,697,248 B1 | | 2/2004 | Luch |
| 6,786,771 B2 | | 9/2004 | Gailus |
| 6,825,411 B2 | * | 11/2004 | Pommerenke et al. ....... 174/388 |

(Continued)

FOREIGN PATENT DOCUMENTS

| | | |
|---|---|---|
| EP | 1612187 A1 | 1/2006 |
| JP | 06-021683 | 1/1994 |

(Continued)

OTHER PUBLICATIONS

Park, Ki-Yeon, et al., Application for MWNT-added Glass Fabric/Epoxy Composites to Electromagnetic Wave Shielding Enclosure, Department of Aerospace Engineering, Korea Advanced institute of Science and Technology, Composite Structures, v 81, n 3, 401-6, 2007; ISSN: 0263-8223; DOI: 10.1016/j.compstruct.2006.08.029; Publisher: Elsevier Science Ltd., UK.

*Primary Examiner* — Hung Ngo
(74) *Attorney, Agent, or Firm* — Marger Johnson & McCollom, PC

(57) ABSTRACT

A noise dampening tape and gasket material for reducing or preventing unwanted electromagnetic interference from escaping or entering an enclosure. The noise dampening gasket includes an inner core section, a carbon material layer surrounding the inner core section, an insulating layer surrounding the carbon material layer, and a metal shield layer surrounding the insulating layer. The noise dampening tape includes a metal shield layer, an insulating layer adjacent to and in contact with the metal shield layer, a carbon material layer adjacent to and in contact with the insulating layer, and an adhesive layer disposed on a surface of the carbon material layer. A second adhesive layer can be disposed on a surface of the metal shield layer.

13 Claims, 7 Drawing Sheets

(56) References Cited

U.S. PATENT DOCUMENTS

| | | |
|---|---|---|
| 7,087,842 B2 | 8/2006 | Belli et al. |
| 7,276,664 B2 | 10/2007 | Gagnon |
| 7,738,942 B2 | 6/2010 | Weiner et al. |
| 7,939,167 B2 | 5/2011 | Kim et al. |
| 8,324,515 B2 | 12/2012 | Stevenson et al. |
| 2005/0045358 A1 | 3/2005 | Arnold |
| 2006/0083948 A1 | 4/2006 | Toshiyuki et al. |
| 2007/0116916 A1 | 5/2007 | Ito et al. |
| 2007/0293086 A1 | 12/2007 | Liang et al. |
| 2009/0095523 A1 | 4/2009 | Stevenson et al. |
| 2009/0104405 A1 | 4/2009 | Patten et al. |
| 2009/0111325 A1 | 4/2009 | Ju |
| 2009/0159328 A1 | 6/2009 | Dai et al. |
| 2009/0287426 A1 | 11/2009 | Kukowski |
| 2009/0291608 A1 | 11/2009 | Choi et al. |
| 2010/0086729 A1 | 4/2010 | Long |
| 2010/0178487 A1 | 7/2010 | Arai et al. |
| 2010/0188833 A1 | 7/2010 | Liang et al. |
| 2010/0300744 A1 * | 12/2010 | Romanko et al. ............ 174/388 |
| 2011/0209909 A1 | 9/2011 | Doneker et al. |
| 2011/0266023 A1 | 11/2011 | Doneker et al. |
| 2011/0309845 A1 | 12/2011 | Kukowski |

FOREIGN PATENT DOCUMENTS

| | | |
|---|---|---|
| JP | 2004-095847 | 3/2004 |
| JP | 2005-285923 | 10/2005 |
| JP | 2006-332260 | 12/2006 |
| JP | 2009174956 | 8/2009 |
| JP | 2010062571 | 3/2010 |
| KR | 10-2011-0016661 | 2/2011 |
| TW | 200929459 | 7/2009 |
| TW | 200929725 | 7/2009 |

* cited by examiner

NOISE DAMPENING ENERGY EFFICIENT TAPE AND GASKET MATERIAL

TECHNICAL FIELD

This disclosure relates to electromagnetic noise dampening materials, and, more particularly, to noise dampening energy efficient tape and gasket material.

BACKGROUND

Electromagnetic noise can escape or otherwise be emitted from enclosures, which can interfere with electronic circuits or other devices nearby. Signals transmitted over electrical cables or through the air can be impacted, even severely disrupted, by the electromagnetic emissions. Most enclosures have edges, seams, openings, physical interfaces, and the like, through which the electromagnetic noise can escape. The types of enclosures that can cause such issues include personal computers, computer server equipment, broadcast equipment, sensitive satellite control devices, cellular tower equipment, handheld devices, and indeed, any enclosure that surrounds or contains electrical components such as circuit elements, conductors, or the like.

In some cases, it is desirable to prevent electromagnetic radiation or noise originating from external sources from penetrating the enclosure through similar edges, seams, openings, interfaces, and the like, which can otherwise cause unwanted interference with circuits and other components located within the enclosure. This can be of particular concern with test chambers or other similar types of test equipment and enclosures.

Government agencies such as the Federal Communications Commission (FCC), among other private and public bodies, require the adherence to exacting standards for the emission of electromagnetic radiation. Much effort is expended in complying with the various laws and rules governing such emissions. Compliance through testing, redesigns, certifications, and the like, quite often requires the devotion of significant resources and time by product developers.

Conventional techniques for addressing these problems include redesigning the enclosure to reduce the number of places in which the electromagnetic energy escapes and/or enters the enclosure. Other typical approaches include covering the seams and openings using sheet metal. Still other approaches require arduous testing after each iteration of enclosure redesign, leading to further enclosure redesigns. Efforts to address the consequences of unwanted electromagnetic noise unfortunately can lead to less efficient designs. For instance, the energy efficiency of the system can become a concern because one approach for overcoming unwanted electromagnetic interference is to boost the power of the signals themselves to compensate for the noise. Such approaches lead to energy waste and are environmentally unwise.

Accordingly, a need remains for a noise dampening energy efficient tape and gasket material for reducing unwanted electromagnetic interference between enclosures and devices external to the enclosures. In addition, it would be desirable to have a more energy efficient and cost effective solution for addressing leakage of electromagnetic noise to and from enclosures. Embodiments of the invention address these and other limitations in the prior art.

The foregoing and other features of the invention will become more readily apparent from the following detailed description, which proceeds with reference to the accompanying drawings.

DETAILED DESCRIPTION

Embodiments of the invention include noise dampening energy efficient tape and gaskets, and associated materials and components. The terms "electromagnetic noise" or "interference" as used herein generally refer to unwanted electromagnetic waves or signals having the potential to disrupt the operation of electronic equipment or other devices. It should be understood, however, that the embodiments disclosed herein can provide beneficial electromagnetic wave dampening for any type of electromagnetic signal, whether or not it is considered "noise" per se, and whether or not actual disruption is caused, and therefore, such terms should be construed broadly.

Figure 1A:
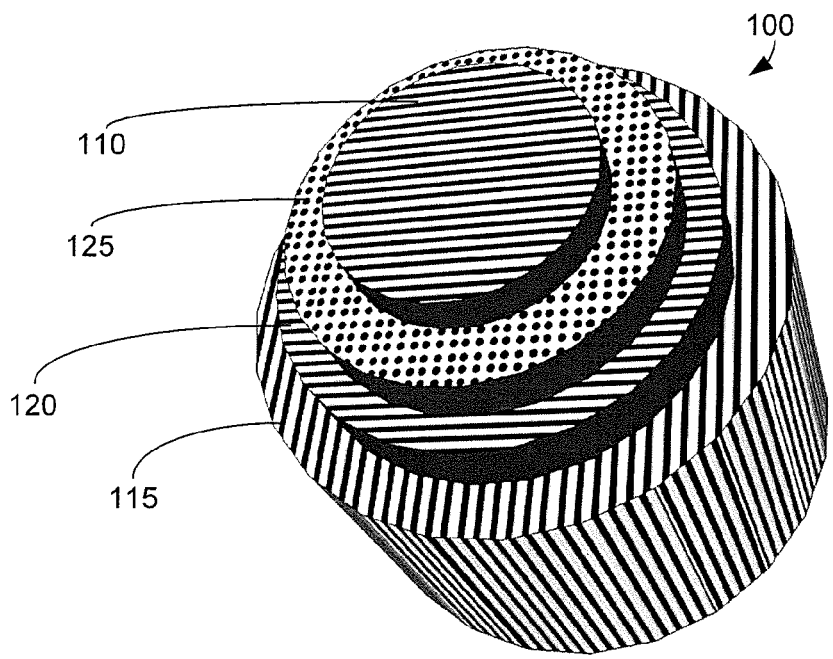
FIG. 1A illustrates a perspective view of an example of a noise dampening energy efficient circuit gasket according to an embodiment of the present invention.
Figure 1B:
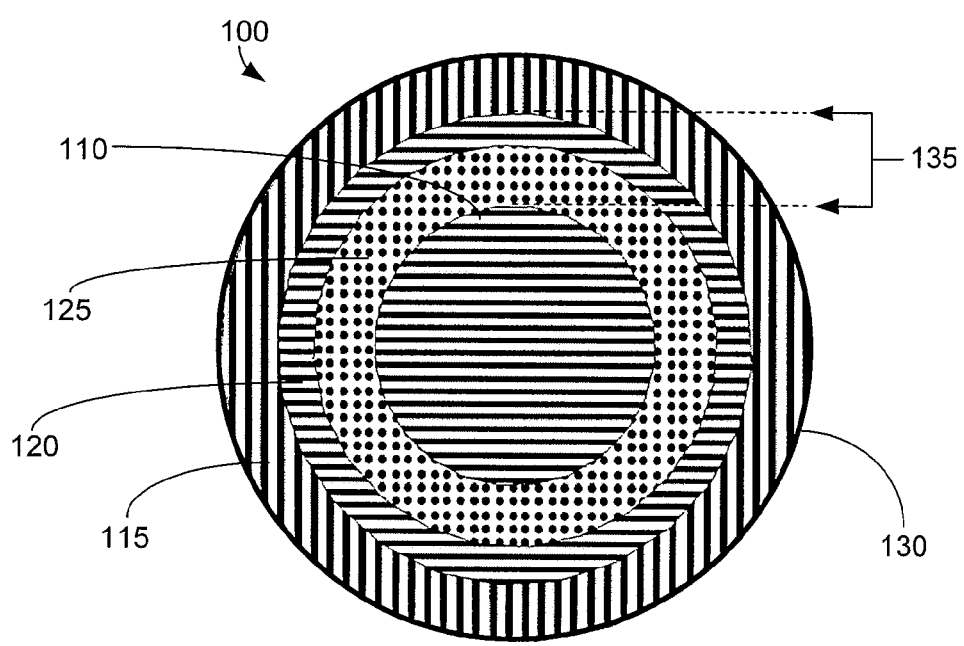
FIG. 1B illustrates a cross-sectional view of the noise dampening energy efficient gasket of FIG. 1A.

FIG. 1A illustrates a perspective view of an example of a noise dampening energy efficient circuit gasket 100 according to an embodiment of the present invention. FIG. 1B illustrates a plan view of the noise dampening gasket 100 of FIG. 1A. Reference is now made to FIGS. 1A and 1B.

The noise dampening gasket 100 includes an inner core section 110, a carbon material layer 125 surrounding the inner core section 110, an insulating layer 120 surrounding the carbon material layer 125, and a metal shield layer 115 surrounding the insulating layer 120. In some embodiments, an outer insulating and protective film 130 covers the metal shield layer 115.

The carbon material layer 125 is preferably up to one (1) millimeter in thickness, although thicker layers can be used.

In some embodiments, the carbon material layer 125 can include resin-impregnated woven carbon fiber fabric. In a preferred embodiment, the resin-impregnated carbon material has a specific resistance no greater than 100 $\Omega/cm^2$. In some embodiments, the carbon material layer 110 includes carbon nanotube material.

The carbon material layer 110 can include strands of carbon fiber running along a length of the gasket 100, for example, in parallel relative to an axial direction of the inner core section 110. In some embodiments, substantially all of the fiber strands of the carbon material layer 125 are disposed in parallel relative to the axial direction of the inner core section 110.

Alternatively, the strands of carbon fiber may run circumferentially around the gasket 100 relative to the inner core section 110. In yet another configuration, the multiple layers of strands of carbon fiber can be disposed one atop another, and/or woven, with each layer having the carbon strands orientated at a different angle respective to one another. For example, one layer of strands can be orientated at 90 degrees relative to another adjacent layer.

In some embodiments, the carbon material layer 125 includes a first layer having fiber strands orientated in a first direction at substantially 45 degrees relative to an axial direction of the inner core section 110, and a second layer having fiber strands orientated in a second direction crossing the fiber strands of the first layer at substantially 45 degrees relative to the axial direction of the inner core section 110.

In this manner, electrons can travel along certain paths or patterns in the carbon material layer, allowing the electromagnetic noise characteristics of the environment to be controlled. It should be understood that a weave pattern can be designed to include other forms or patterns depending on the qualities and noise characteristics of a particular circuit or enclosure with which the gasket 100 is used.

The metal shield layer 115 can be a flexible conducting metal layer, including for example, copper (Cu), but can include any suitable conductor including gold (Au), silver (Ag), and so forth. The inner core section 110 is formed from either a solid pliable shape of conducting or non-conducting material. The insulating layer 120 is preferably glass fiber material, but any suitable dielectric insulating material can be used.

The metal shield layer 115, the insulating layer 120, and the carbon material layer 125 form an electromagnetic dampening zone 135 surrounding the inner core section 110 in which the carbon material layer 125 enhances the shielding characteristics of the metal shield layer 115. The positioning of the carbon material layer 125 with respect to the metal shield layer 115, separated by the insulating layer 120, enhances the metal shield layer operation of dampening electromagnetic noise.

The carbon material layer 125 can directly contact the inner core section 110. Similarly, the metal shield layer 115 can directly contact the insulating layer 120. In addition, the insulating layer 120 can directly contact the carbon material layer 125. It should be understood that while the perspective view of the gasket 100 in FIG. 1A shows different layer protruding from the gasket, the layers of the gasket can be flush so that the gasket 100 is formed in a substantially cylindrical embodiment. It should also be understood that the cross sectional shape of the gasket 100 need not be cylindrical, but can be formed in other shapes such as rectangular, triangular, hexagonal, and so forth.

Figure 2A:
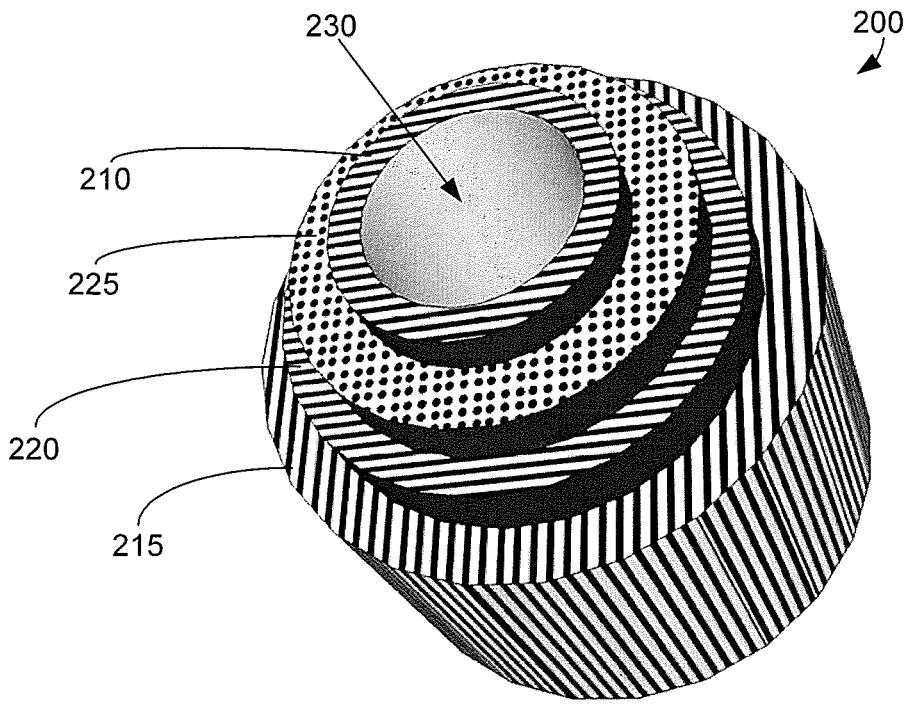
FIG. 2A illustrates a perspective view of another example of a noise dampening energy efficient circuit gasket according to another embodiment of the present invention.

FIG. 2A illustrates a perspective view of another example of a noise dampening energy efficient circuit gasket 200 according to another embodiment of the present invention.

Figure 2B:
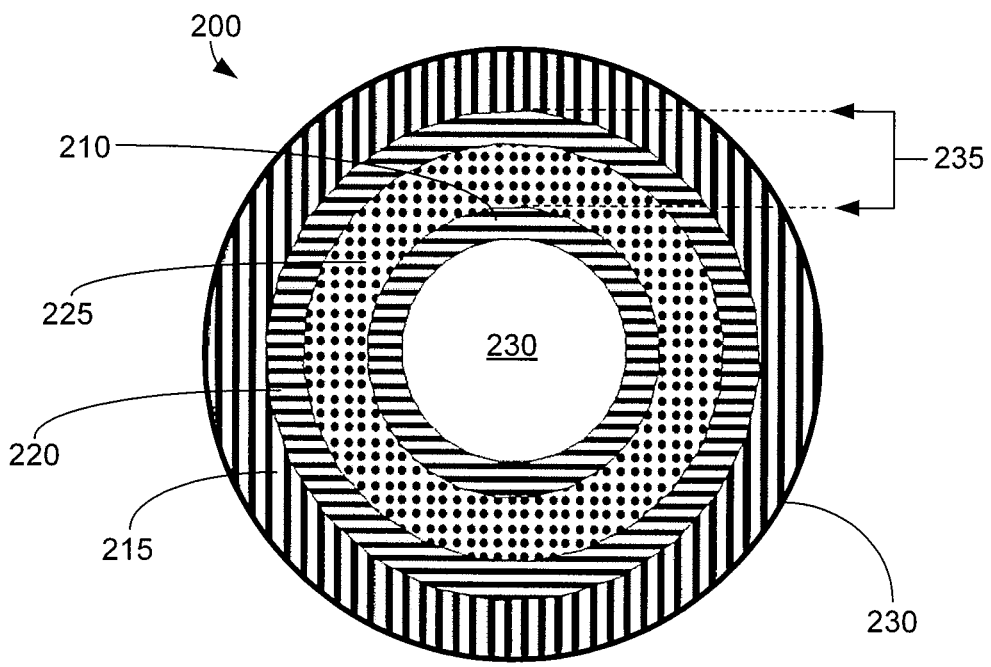
FIG. 2B illustrates a cross-sectional view of the noise dampening energy efficient gasket of FIG. 2A.

FIG. 2B illustrates a plan view of the noise dampening gasket 200 of FIG. 2A. Reference is now made to FIGS. 2A and 2B.

The noise dampening gasket 200 includes an inner core section 210, a carbon material layer 225 surrounding the inner core section 210, an insulating layer 220 surrounding the carbon material layer 225, and a metal shield layer 215 surrounding the insulating layer 220. In some embodiments, an outer insulating and protective film 230 covers the metal shield layer 215. The inner core section 210 includes a cylindrical opening 230 therein extending through the gasket.

The composition, dimensions, and characteristics of the components of gasket 200 are similar to or the same as those described above with reference to gasket 100, and so an abbreviated description is included with reference to gasket 200. The primary difference is that the inner core section 210 includes the opening 230 therein for receiving a conductor or other type of wire or cable.

In similar fashion, the metal shield layer 215, the insulating layer 220, and the carbon material layer 225 form an electromagnetic dampening zone 235 surrounding the inner core section 210 in which the carbon material layer 225 enhances the shielding characteristics of the metal shield layer 215, thereby reducing or preventing unwanted electromagnetic interference.

Figure 3:
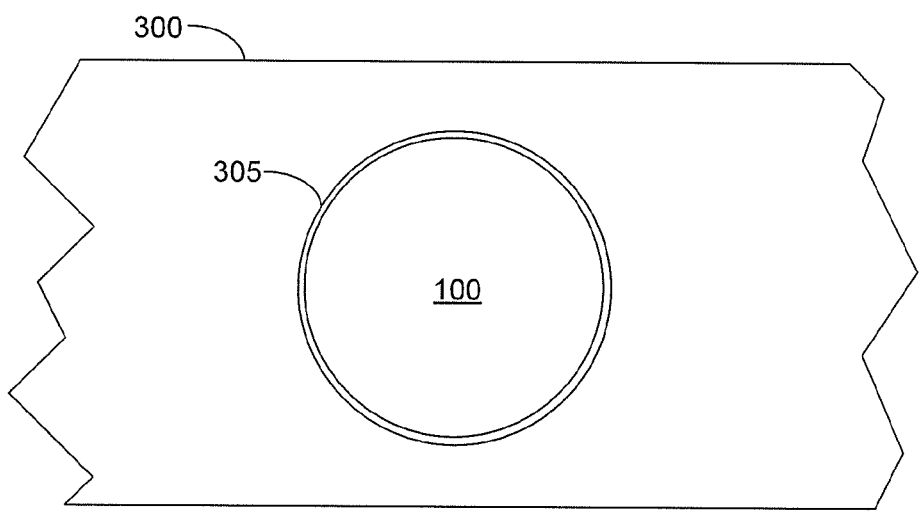
FIG. 3 illustrates a plan view of an enclosure having the noise dampening gasket of FIGS. 1A and 1B fitted thereto.

FIG. 3 illustrates a plan view of an enclosure 300 having the noise dampening gasket 100 of FIGS. 1A and 1B fitted thereto. The enclosure 300 may include walls that form a container for sensitive electronics such as circuits components, conductors, or the like. An opening or interface 305 can be disposed in a wall of the enclosure 300, and the noise dampening gasket 100 can permanently or temporarily "plug" the opening. FIG. 3 illustrates the gasket 100 inserted in the opening 305 of the wall of the enclosure 300 so that electromagnetic noise is reduced or otherwise prevented from escaping or entering the enclosure 300.

Figure 4:
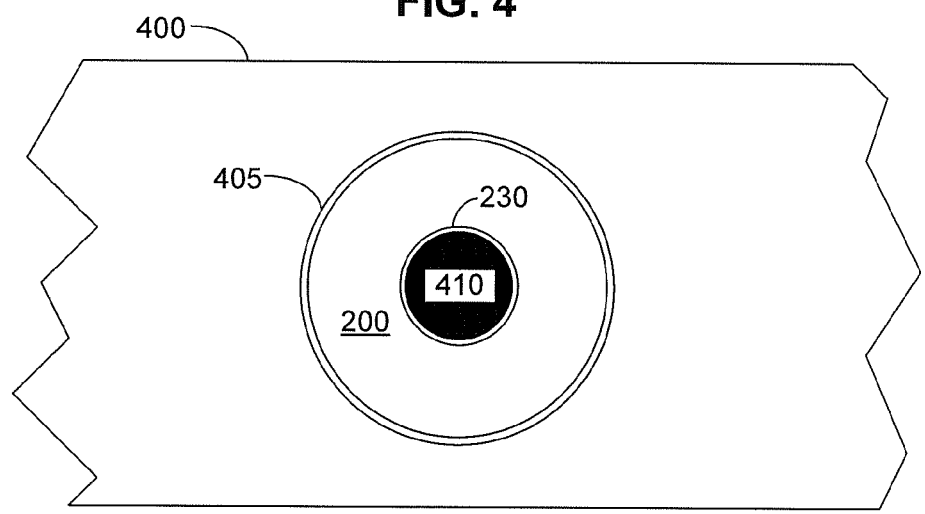
FIG. 4 illustrates a plan view of an enclosure having the noise dampening gasket of FIGS. 2A and 2B fitted thereto.
Figure 5:
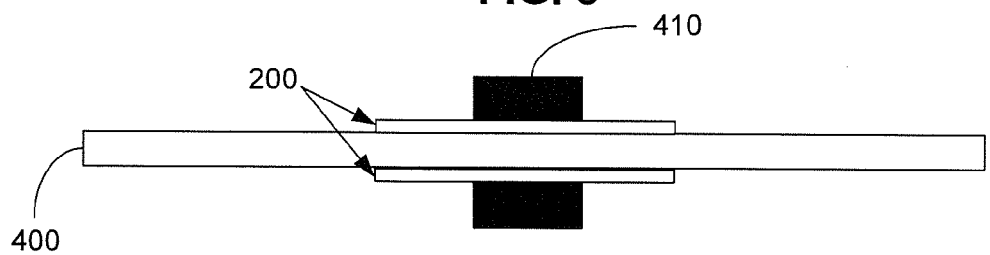
FIG. 5 illustrates a side elevation view of the enclosure of FIG. 4 having the noise dampening gasket of FIGS. 2A and 2B fitted thereto.

FIG. 4 illustrates a plan view of an enclosure 400 having the noise dampening gasket 200 of FIGS. 2A and 2B fitted thereto. FIG. 5 illustrates a side elevation view of the enclosure 400 of FIG. 4 having the noise dampening gasket 200 of FIGS. 2A and 2B fitted thereto. Reference is now made to FIGS. 4 and 5.

The enclosure 400 may include walls that form a container for sensitive electronics such as circuit components, conductors, or the like. An opening or interface 405 can be disposed in a wall of the enclosure 400, and the noise dampening gasket 400 can permanently or temporarily "plug" the opening. FIG. 4 illustrates the gasket 200 inserted in the opening 405 of the wall of the enclosure 400 so that electromagnetic noise is reduced or otherwise prevented from escaping or entering the enclosure 400.

Moreover, a conductor 410 such as a wire or cable can be disposed within the opening 230 of the inner core section 210 of the gasket 200 so that devices or components contained within the enclosure 400 can interface with devices, power sources, or other components located external to the enclosure 400. The electromagnetic dampening zone 235 is structured to reduce electromagnetic noise emitted by the conductor 410. In addition, the gasket 200 is structured to prevent electromagnetic noise from escaping or entering the enclosure 400.

Figure 6A:
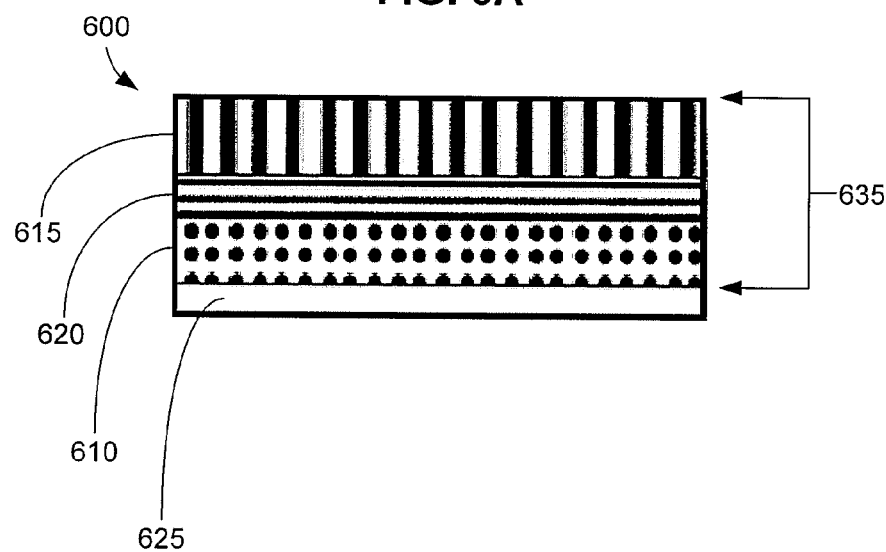
FIG. 6A illustrates a cross sectional view of a noise dampening energy efficient tape according to another example embodiment of the present invention
Figure 6B:
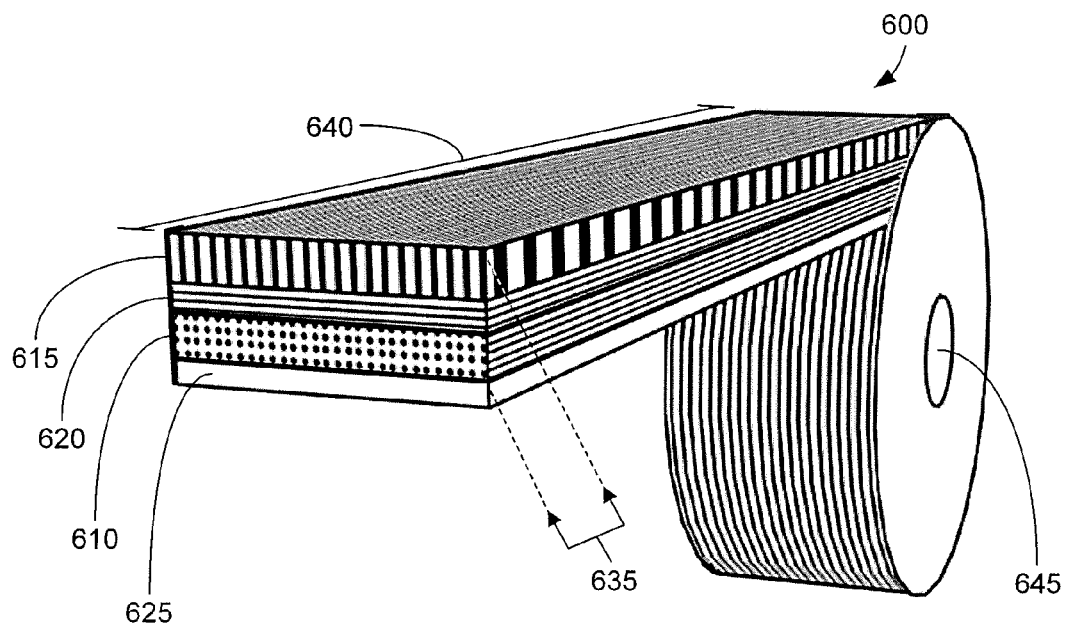
FIG. 6B illustrates a perspective view of the noise dampening energy efficient tape of FIG. 6A.

FIG. 6A illustrates a cross sectional view of a noise dampening energy efficient tape 600 according to another example embodiment of the present invention. FIG. 6B illustrates a perspective view of the noise dampening tape 600 of FIG. 6A. Reference is now made to FIGS. 6A and 6B.

The noise dampening tape 600 includes a metal shield layer 615, an insulating layer 620 adjacent to and in contact with the metal shield layer 615, a carbon material layer 610 adjacent to and in contact with the insulating layer 620, and an adhesive layer 625 disposed on a surface of the carbon material layer 610.

The carbon material layer 610 is preferably up to one (1) millimeter in thickness, although thicker layers can be used. In some embodiments, the carbon material layer 610 can include resin-impregnated woven carbon fiber fabric. In a preferred embodiment, the resin-impregnated carbon material has a specific resistance no greater than 100 $\Omega/cm^2$. In some embodiments, the carbon material layer 610 includes carbon nanotube material.

The carbon material layer 610 can include strands of carbon fiber running along a length of the tape 600, for example, in parallel relative to the lengthwise direction 640. In some embodiments, substantially all of the fiber strands of the carbon material layer 610 are disposed in parallel relative to the lengthwise direction 640 of the tape 600. The tape can be wound or otherwise disposed around core 645 for easy storage, transporting and dispensing.

In some embodiments, the multiple layers of strands of carbon fiber can be disposed one atop another, and/or woven, with each layer having the carbon strands orientated at a different angle respective to one another. For example, one layer of strands can be orientated at 90 degrees relative to another adjacent layer. In some embodiments, the carbon material layer 610 includes a first layer having fiber strands orientated in a first direction at substantially 45 degrees relative to a lengthwise direction 640 of the tape, and a second layer having fiber strands orientated in a second direction crossing the fiber strands of the first layer at substantially 45 degrees relative to the lengthwise direction 640 of the tape.

In this manner, electrons can travel along certain paths or patterns in the carbon material layer, allowing the electromagnetic noise characteristics of the environment to be controlled. It should be understood that a weave pattern can be designed to include other forms or patterns depending on the qualities and noise characteristics of a particular enclosure or surface with which the tape 600 is used.

The metal shield layer 615 can be a flexible conducting metal layer, including for example, copper (Cu), but can include any suitable conductor including gold (Au), silver (Ag), and so forth. The insulating layer 620 is preferably flexible glass fiber material, but any suitable flexible dielectric insulating material can be used.

The metal shield layer 615, the insulating layer 620, and the carbon material layer 610 form an electromagnetic dampening zone 635 in which the carbon material layer 610 enhances the shielding characteristics of the metal shield layer 615. The positioning of the carbon material layer 610 with respect to the metal shield layer 615, separated by the insulating layer 620, enhances the metal shield layer operation of dampening electromagnetic noise.

Figure 7A:
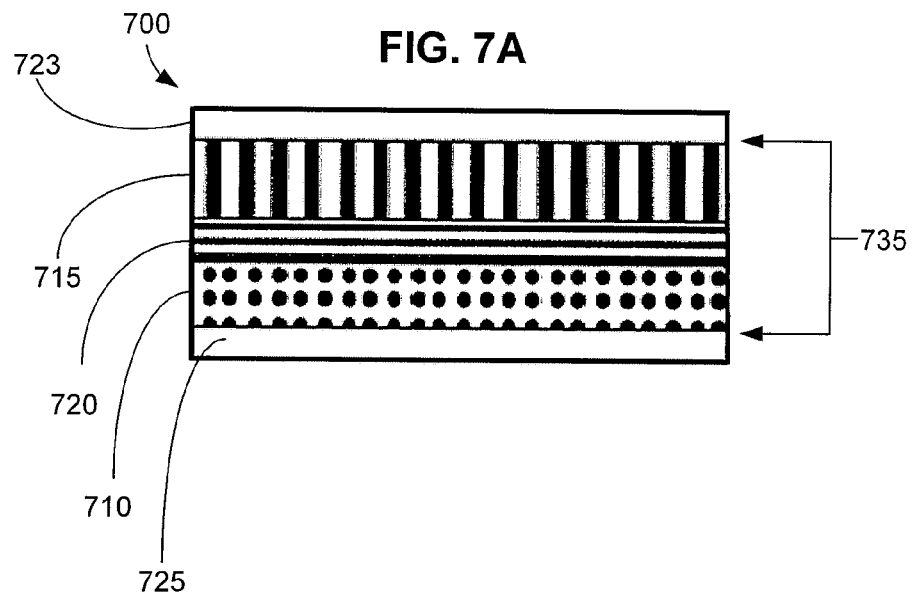
FIG. 7A illustrates a cross sectional view of a noise dampening energy efficient tape according to another example embodiment of the present invention.
Figure 7B:
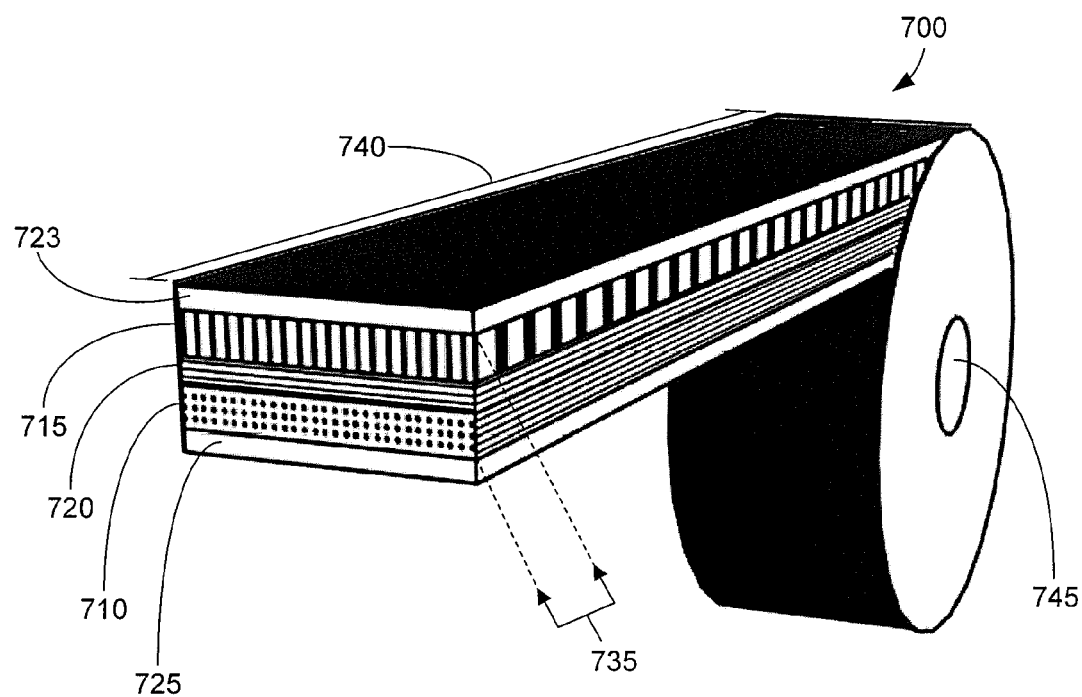
FIG. 7B illustrates a perspective view of the noise dampening energy efficient tape of FIG. 7A.

FIG. 7A illustrates a cross sectional view of a noise dampening energy efficient tape 700 according to another example embodiment of the present invention. FIG. 7B illustrates a perspective view of the noise dampening tape 700 of FIG. 7A. Reference is now made to FIGS. 7A and 7B.

The noise dampening tape 700 includes a metal shield layer 715, an insulating layer 720 adjacent to and in contact with the metal shield layer 715, a carbon material layer 710 adjacent to and in contact with the insulating layer 720, and an adhesive layer 725 disposed on a surface of the carbon material layer 710. In addition, the noise dampening tape 700 includes a second adhesive layer 723 disposed on a surface of the metal shield layer 715.

The composition, dimensions, and characteristics of the components of noise dampening tape 700 are similar to or the same as those described above with reference to noise dampening tape 600, and so an abbreviated description is included with reference to tape 700.

Electromagnetic noise can be prevented from escaping or entering an enclosure, or otherwise passing through a surface, depending on the orientation of the double adhesive tape 700. If it is desirable to prevent electromagnetic noise from escaping an enclosure, the tape 700 is orientated so that the carbon material layer 710 is positioned toward the inside of the enclosure, and the metal shield layer is positioned toward the outside of the enclosure. If placed within the inside of the enclosure, one adhesive layer can be used to affix the tape in the proper orientation to the surfaces of the inside of the enclosure. If placed outside of the enclosure, the other adhesive layer can be used to affix the tape in the proper orientation to the surfaces of the outside of the enclosure.

Conversely, if it is desirable to prevent electromagnetic noise from entering the enclosure, the tape 700 is orientated so that the carbon material layer 710 is positioned toward the outside of the enclosure, and the metal shield layer is positioned toward the inside of the enclosure. Since the tape 700 includes adhesive on both upper and lower surfaces, positioning and attaching the tape is made simple for either orientation.

The metal shield layer 715, the insulating layer 720, and the carbon material layer 710 form an electromagnetic dampening zone 735 in which the carbon material layer 710 enhances the shielding characteristics of the metal shield layer 715. The positioning of the carbon material layer 710 with respect to the metal shield layer 715, separated by the insulating layer 720, enhances the metal shield layer operation of dampening electromagnetic noise.

Figure 8:
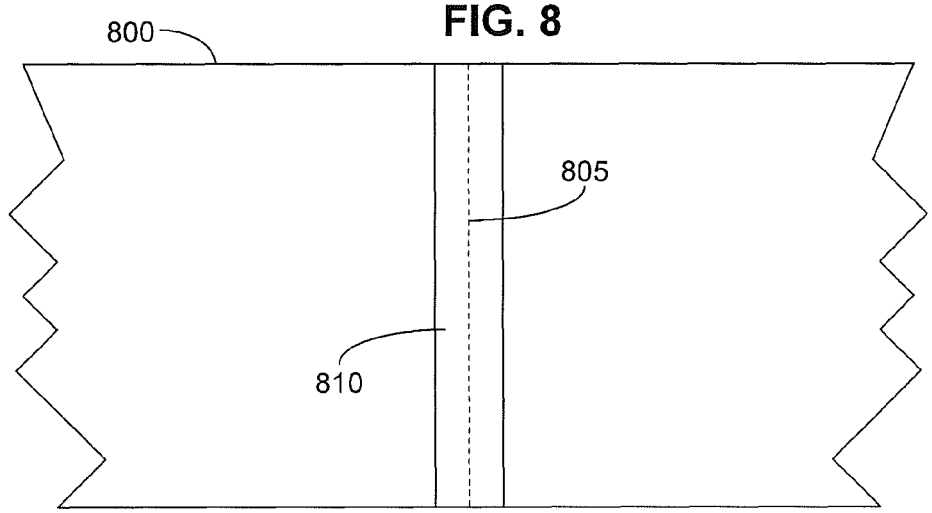
FIG. 8 illustrates a plan view of an enclosure having the noise dampening tape applied thereto along a seam.

FIG. 8 illustrates a plan view of an enclosure and/or surface 800 having the noise dampening tape 810 applied thereto along a seam. The noise dampening tape 810 corresponds to either the noise dampening tape 600 or the noise dampening tape 700 described above. The enclosure 800 can include walls or surfaces in which a seam 805 is present. The noise dampening tape 810 can be disposed over the seam to reduce or prevent electromagnetic noise from passing through the seam. It should be understood that the noise dampening tape 810 can be disposed on either side of the seam 805. Moreover, the noise dampening tape 810 can be disposed over the seam 805 of any surface, whether as part of the enclosure 800, or as a separate standalone surface. In other words, the noise dampening tape 600 can cover one or more seams 805 associated with one or more surfaces 800.

Figure 9:
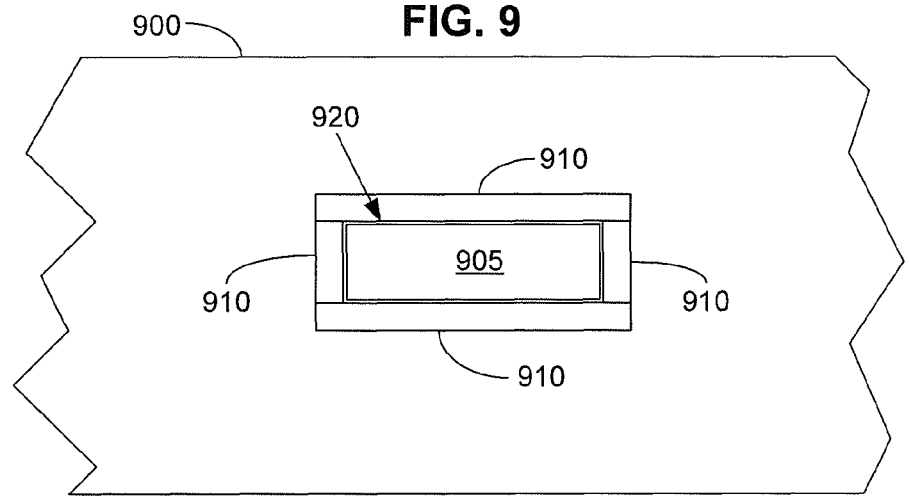
FIG. 9 illustrates a plan view of an enclosure having the noise dampening tape applied thereto around a physical interface.

FIG. 9 illustrates a plan view of an enclosure and/or surface 900 having the noise dampening tape 910 applied thereto around a physical device 905 or interface. The noise dampening tape 910 corresponds to either the noise dampening tape 600 or the noise dampening tape 700 described above. One or more openings or interfaces 920 may be disposed through one or more surfaces 900. A physical component or device 905 can be disposed in the one or more openings 920. The component 905 can be, for example, a control panel, an input/output interface, a ventilation unit, an access panel, or the like. The noise dampening tape 910 can be disposed on the one or more surfaces 900 around the component 905, and/or covering any cracks between the physical component 905 and the one or more openings 920.

Figure 10:
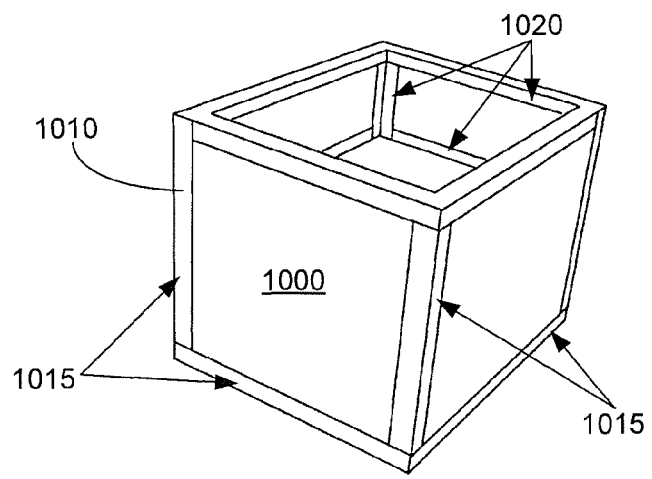
FIG. 10 illustrates a perspective view of an enclosure having the noise dampening tape applied to edges thereof.

FIG. 10 illustrates a perspective view of an enclosure 1000 having the noise dampening tape 1010 applied to outside edges 1015 and inside edges 1020 thereof. The noise dampening tape 1010 corresponds to either the noise dampening tape 600 or the noise dampening tape 700 described above. Edges of enclosures are often vulnerable to leakages due to the nature of the bends of the walls or the surface couplings, and can therefore contribute to leaks in electromagnetic noise.

The noise dampening tape 1010 can be disposed on inside edges 1020 with the carbon material layer orientated either toward the inside of the enclosure 1000 or toward the outside of the enclosure 1000. Moreover, the noise dampening tape 1010 can be disposed on outside edges 1015 with the carbon material layer orientated either toward the inside of the enclosure 1000 or toward the outside of the enclosure 1000. When the carbon material layer is orientated toward the inside of the enclosure, electromagnetic noise is contained within the enclosure and leakages are reduced or eliminated. Alternatively, when the carbon material layer is orientated toward the outside of the enclosure, electromagnetic noise is prevented from penetrating the enclosure.

Figure 11:
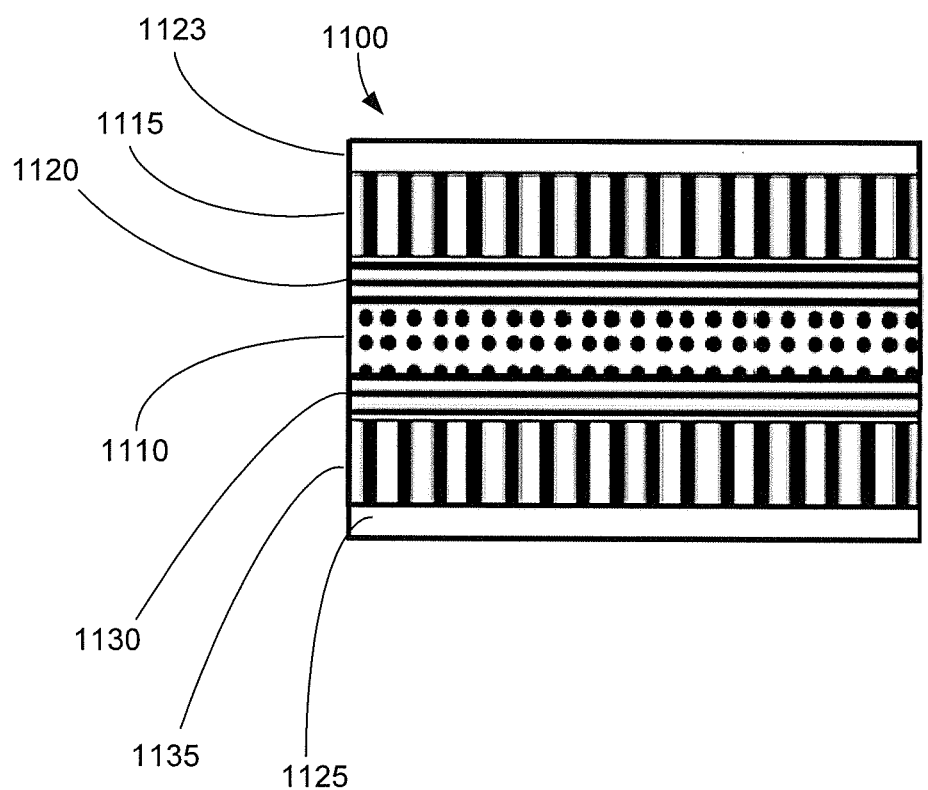
FIG. 11 illustrates a cross sectional view of a multi-directional noise dampening energy efficient tape according to yet another example embodiment of the present invention.

FIG. 11 illustrates a cross sectional view of a multi-directional noise dampening energy efficient tape 1100 according to yet another example embodiment of the present invention.

The multi-directional noise dampening tape 1100 can dampen electromagnetic noise irrespective of the direction in which the electromagnetic waves are incident upon the tape. In other words, the noise dampening tape can prevent or reduce electromagnetic noise or radiation from passing in either direction through the tape.

The multi-directional noise dampening tape 1100 includes a first metal shield layer 1115, a first insulating layer 1120 adjacent to and in contact with the first metal shield layer 1115, a carbon material layer 1110 adjacent to and in contact with the first insulating layer 1120, a second insulating layer 1130 adjacent to and in contact with the carbon material layer 1110, and a second metal shield layer 1135 adjacent to and in contact with the second insulating layer 1130. In addition, the tape 1100 can include an adhesive layer 1123 disposed on a surface of the first metal shield layer 1115, and/or an adhesive layer 1125 disposed on a surface of the second metal shield layer 1135.

Besides the difference in the number of layers in the tape, the composition, dimensions, and characteristics of the components of noise the dampening tape 1100 are similar to or the same as those described above with reference to the noise dampening tapes 600 and 700, and therefore, a detailed description is omitted for the sake of brevity. It should be understood, however, that the noise dampening tape 1100 can be used in conjunction with any of the embodiments or usages described above.

While some examples of noise dampening gasket and tape material types and configurations are disclosed herein, persons with skill in the art will recognize that the inventive concepts disclosed herein can be implemented with a variety of different circuit gaskets, tapes, enclosures, shapes, and forms. The thickness of each of the various layers including the carbon material layer, the metal shield layers, the glass fiber material layers, and/or the insulating dielectric layers, can be, for example, up to one (1) millimeter in thickness, although in practice, some layers are designed to be thicker than other layers, and can be sized according to the expected frequencies at which signals are to be operated. For example, with higher frequency signals, thicker layers can be used. Thus, higher frequency signals are supported in a lower-noise environment.

Power and energy efficiencies are also improved. For instance, as the noise qualities of an enclosure are improved, the signal qualities also improve, and the circuits and other components contained within the enclosure can operate with lower voltages, use fewer parts, less power, and so forth. Server farms use massive amounts of energy to operate multiple circuit boards and other components, sometimes 24 hours per day, 365 days per year.

In other words, the power consumption characteristics and energy efficiencies associated with components operating within an enclosure can be significantly improved, and can reduce these demands on the energy infrastructure. Given that there are millions of enclosures having circuit boards and other devices contained therein, such power and energy improvements can quickly multiply into significant reductions in power usage, battery production and disposal, etc., thereby boosting conservations efforts worldwide.

Methods for construction the noise dampening gasket and tape are also contemplated as described herein. For example, a method for constructing a noise dampening gasket (e.g., 100/200) can include arranging a plurality of concentric layers, as described in detail above, one atop another, around the inner core, and infusing epoxy into the carbon material layer. A method for constructing the noise dampening tape can include forming the various layers, as described in detail above, one atop another, and rolling or otherwise winding the layers around a core for simple storage, transporting, and dispensing or other usage.

Consequently, in view of the wide variety of permutations to the embodiments described herein, this detailed description and accompanying material is intended to be illustrative only, and should not be taken as limiting the scope of the invention.

What is claimed is:

1. A noise dampening tape having a planar shape with a lengthwise and a widthwise direction and a thickness dimension, comprising:
   a metal shield layer;
   an insulating layer adjacent to and in contact with the metal shield layer; and
   a carbon material layer adjacent to and in contact with the insulating layer wherein:
   the metal shield layer, the insulating layer, and the carbon material layer form a three-layer electromagnetic dampening zone in which the carbon material layer is spaced from the metal shield layer in the thickness dimension so as to enhance the shielding characteristics of the metal shield layer; and
   the carbon material layer includes an array of carbon fiber strands disposed in parallel transverse to the lengthwise direction of the noise dampening tape.

2. The noise dampening tape of claim 1, further comprising:
   an adhesive layer disposed on a surface of the carbon material layer opposite the insulating layer.

3. The noise dampening tape of claim 2, wherein:
   the adhesive layer comprises a first adhesive layer; and
   the noise dampening tape further comprises a second adhesive layer disposed on a surface of the metal shield layer.

4. The noise dampening tape of claim 1, wherein:
   the carbon material layer includes resin-impregnated carbon fiber having a specific resistance no greater than 100 $\Omega/cm^2$.

5. The noise dampening tape of claim 1, wherein substantially all of the fiber strands of the carbon material layer are disposed in parallel transverse to the lengthwise direction of the noise dampening tape.

6. The noise dampening tape of claim 1, wherein the metal shield layer comprises a first metal shield layer and the insulating layer comprises a first insulating layer, the noise dampening tape further comprising:

a second insulating layer adjacent to and in contact with the carbon material layer;
a second metal shield layer adjacent to and in contact with the second insulating layer;
a first adhesive layer disposed on a surface of the first metal shield layer; and
a second adhesive layer disposed on a surface of the second metal shield layer.

7. The noise dampening tape of claim 1, wherein the carbon fiber strands include a first layer of parallel carbon fiber strands oriented at a first angle to the lengthwise direction of the tape.

8. The noise dampening tape of claim 1, wherein the carbon fiber strands include a first layer of parallel carbon fiber strands oriented at a first angle to the lengthwise direction of the tape and a second layer of parallel carbon fiber strands oriented at a second angle to the lengthwise direction of the tape such that the second layer of carbon fiber strands is transverse to the first layer of carbon fiber strands.

9. The noise dampening tape of claim 8, wherein the first angle and second angle are each about 45 degrees relative to the lengthwise direction of the tape.

10. The noise dampening tape of claim 8, wherein the first and second layers of carbon fiber strands are arranged in a weave pattern.

11. An apparatus, comprising:
one or more surfaces;
one or more seams disposed in the one or more surfaces;
noise dampening tape disposed on the one or more surfaces, the noise dampening tape comprising:
a metal shield layer;
an insulating layer adjacent to and in contact with the metal shield layer;
a carbon material layer adjacent to and in contact with the insulating layer; and
an adhesive layer disposed on a surface of the carbon material layer;
wherein the noise dampening tape covers the one or more seams lengthwise and the carbon material layer includes an array of parallel carbon fiber strands oriented transversely to the lengthwise direction of tape so as to cross the seams.

12. The apparatus of claim 11, further comprising:
one or more openings through the one or more surfaces; and
a component disposed in the one or more openings,
wherein the noise dampening tape is disposed on the one or more surfaces around the component.

13. The apparatus of claim 11, wherein:
the one or more surfaces form an enclosure; and
the noise dampening tape is disposed along one or more edges of the enclosure.

* * * * *